(12) United States Patent
Cheng

(10) Patent No.: US 7,371,649 B2
(45) Date of Patent: May 13, 2008

(54) METHOD OF FORMING CARBON-CONTAINING SILICON NITRIDE LAYER

(75) Inventor: Po-Lun Cheng, Kaohsiung County (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 11/531,283

(22) Filed: Sep. 13, 2006

(65) Prior Publication Data
US 2007/0059870 A1   Mar. 15, 2007

Related U.S. Application Data

(60) Provisional application No. 60/716,848, filed on Sep. 13, 2005.

(51) Int. Cl.
*H01L 21/336* (2006.01)

(52) U.S. Cl. .............. 438/303; 438/791; 257/E21.435
(58) Field of Classification Search ............... 438/784, 438/791, 303; 257/E21.435
See application file for complete search history.

(56) References Cited

U.S. PATENT DOCUMENTS

| 6,746,906 B2* | 6/2004 | Rabkin et al. ............... 438/199 |
| 7,253,123 B2* | 8/2007 | Arghavani et al. .......... 438/786 |
| 2005/0109276 A1* | 5/2005 | Iyer et al. .................... 118/715 |
| 2005/0158983 A1* | 7/2005 | Hoshi et al. ................ 438/623 |
| 2005/0287747 A1* | 12/2005 | Chakravarti et al. ........ 438/288 |
| 2006/0189065 A1* | 8/2006 | Wang et al. ................ 438/216 |

* cited by examiner

*Primary Examiner*—Trung Dang
(74) *Attorney, Agent, or Firm*—Jianq Chyun IP Office

(57) ABSTRACT

A method for forming a carbon-containing silicon nitride layer with superior uniformity by low pressure chemical vapor deposition (LPCVD) using disilane, ammonia and at least one carbon-source precursor as reactant gases is provided.

14 Claims, 4 Drawing Sheets

METHOD OF FORMING CARBON-CONTAINING SILICON NITRIDE LAYER

CROSS-REFERENCE TO RELATED APPLICATION

This application claims the priority benefits of U.S. provisional application Ser. No. 60/716,848, filed on Sep. 13, 2005. All disclosure of this application is incorporated herein by reference.

BACKGROUND OF THE INVENTION

1. Field of the Invention

The present invention generally relates to a method of forming a semiconductor device. More particularly, the present invention relates to a method for forming a carbon-containing silicon nitride layer.

2. Description of Related Art

The metal-oxide-semiconductor (MOS) field effect transistor is the most important device applied for ultra-large-integrated-circuits, such as microprocessors and semiconductor memories. The MOSFET transistor generally includes a conductive gate structure and a source/drain region disposed on both sides of the gate structure. To increase the number of components per IC chip, the device dimensions must be scaled down. As the device dimension shrinks, the channels become shorter, thus inducing undesirable short channel effects. In the prior art, the source/drain region is coupled with a lightly doped drain (LDD) structure for preventing short channel effect and hot carrier effects.

During the fabrication of the MOSFET, after forming the gate electrode, the offset spacer and/or the spacer, made of silicon oxide or silicon nitride, will be formed on the two sidewalls of the gate electrode in the subsequent processes. Afterwards, ion implantation will be performed to form the LDD structure or the source and drain regions at the two sides of the gate electrode, through the offset spacer or the spacer. For example, a composite silicon oxide/silicon nitride spacer may be formed on the sidewalls of the gate by forming an offset oxide layer and a silicon nitride layer covering the substrate and the gate electrode in sequence and then performing etching to remove a portion of the silicon nitride layer until the offset oxide layer is exposed. During the ion implantation process, the uniformity of the oxide or nitride layer of the offset spacer or the spacer has great impact on the dopant profile or junction profile of the formed LDD structure or even the source/drain region.

However, when the size of the device and the line-width shrink, the thickness of each layer and the process margin in each layer also become smaller. Especially if the offset spacer or spacer is made from a non-uniform silicon nitride layer, not only the junction depth of the subsequent doped regions region may be diverse, the effective channel length of the gate electrode may also be changed, which significantly affects the reliability and uniformity of the semiconductor devices on the wafer.

SUMMARY OF THE INVENTION

Accordingly, the present invention is directed to a method for forming a carbon-containing silicon nitride layer with superior uniformity, by low pressure chemical vapor deposition (LPCVD) using disilane, ammonia and at least one carbon-source precursor as reactant gases. Moreover, the carbon content of the formed carbon-containing silicon nitride layer can be higher than 9%.

The present invention is also directed to a method for forming a gate structure, by forming offset spacers or spacers including at least a carbon-containing silicon nitride layer of superior uniformity and high carbon content. Therefore, the performance of the device can be enhanced.

According to an embodiment of the present invention, the present invention provides a method for forming a gate structure. After forming the gate electrode on the provided substrate, a material layer is formed over the substrate and covering the gate electrode. The material layer includes at least a carbon-containing silicon nitride layer formed by low pressure chemical vapor deposition (LPCVD) using disilane, ammonia and at least a carbon-source precursor as reactant gases. Subsequent to etching back the material layer, spacers are formed over sidewalls of the gate electrode. Afterwards, a source/drain region is formed in the substrate.

The methods of the present invention can further includes forming an offset material layer and etching back the offset material layer to form offset spacers on the sidewalls of the gate electrode. The offset material layer includes at least a carbon-containing silicon nitride layer formed by low pressure chemical vapor deposition (LPCVD) using disilane, ammonia and at least a carbon-source precursor as reactant gases.

According to the method for forming the carbon-containing silicon nitride layer proposed in this invention, the carbon-containing silicon nitride layer can offer better superior uniformity and high carbon content, when compared with the conventional silicon nitride layer. Furthermore, the carbon in the resultant silicon nitride layer can help trap free hydrogen in the device and prevent boron diffusion exacerbated by free hydrogen. Therefore, due to less free hydrogen and better uniformity, the electrical characteristics of the device are improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
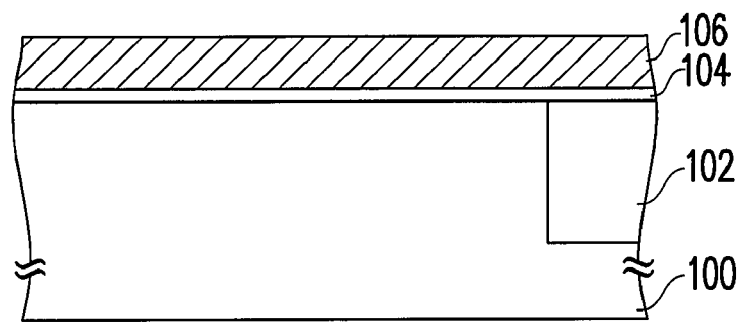
FIGS. 1A to 1E are cross-sectional views of the fabrication process steps for a gate structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

As mentioned above, as the line-width minimizes and the thickness of each layer shrinks, it is important to enhance the uniformity of certain layers, such as the silicon nitride layer for the offset spacer or the spacer for better-quality device or improved standardization of the devices within the wafer.

Currently, it is common to employ $SiH_4$ and $NH_3$ as the reactant gases for forming the silicon nitride layer by the single wafer tools. However, the obtained silicon nitride layer has inferior and unsatisfactory within wafer uniformity, wafer-to-wafer uniformity and lot-to-lot uniformity. Alternatively, furnace can be used to form the silicon nitride layer for the wafers in batch. However, higher thermal budget is required and the production cost is therefore higher.

According to this invention, it is proposed to form a carbon-containing silicon nitride layer with better uniformity by employing $Si_2H_6$, $NH_3$ and at least one carbon-source precursor as the reactant gases, preferably by single wafer tools but also compatible with furnace processes.

According to the present invention, the carbon-containing silicon nitride layer is formed by using disilane ($Si_2H_6$), $NH_3$ and at least one carbon-source precursor as the reactant gases, preferably by low pressure CVD (LPCVD). For example, the carbon-source precursor can be selected from the group consisting of TEASAT (triethylarsenate, $C_6H_{15}AsO_4$), Trans-LC ($C_2H_2Cl_2$), TCS (trichlorosilane, $SiHCl_3$), TMAl (trimethyl aluminum, $Al(CH_3)_3$), $C_2H_4$, $C_3H_6$, TEB (triethylborate, $B(OC_2H_5)_3$), TEPO (triethylphosphate, $PO(C_2H_5O)_3$), TDMAT (tetrakis-dimethylamino titanium, $Ti[N(CH_3)_2]_4$) and the combinations thereof. Preferably, the obtained silicon nitride layer contains more than 9% of carbon. By optimizing the process parameters and/or choosing the appropriate carbon-source precursor, the resultant silicon nitride layer can contain up to about 30% of carbon, for example.

According to the method proposed in this invention, the carbon-containing silicon nitride layer formed by using disilane ($Si_2H_6$), $NH_3$ and at least one carbon-source precursor as the reactant gases by LPCVD is measured to have better within wafer uniformity, wafer-to-wafer uniformity and lot-to-lot uniformity, when compared with the conventional silicon nitride layer. Furthermore, the carbon in the resultant silicon nitride layer can help trap free hydrogen in the device and prevent boron diffusion exacerbated by free hydrogen. Therefore, due to less free hydrogen and better uniformity, the electrical characteristics of the device are improved.

The method for forming the carbon-containing silicon nitride layer proposed in this invention is compatible with and can be incorporated in the manufacturing processes of various semiconductor devices. In the following embodiments, the proposed method for forming the carbon-containing silicon nitride layer is incorporated into the fabrication process steps for a gate structure.

FIGS. 1A to 1E are cross-sectional views of the fabrication process steps for a gate structure according to one preferred embodiment of this invention. Referring to FIG. 1A, a substrate 100 having a gate dielectric layer 104 and at least an isolation structure 102 is provided. The isolation structure 102 is a shallow trench isolation (STI) structure, for example. A conductive layer 106 is formed on the gate dielectric layer 104. The material of the conductive layer 106 is polysilicon or other suitable materials, for example.

Figure 1B:
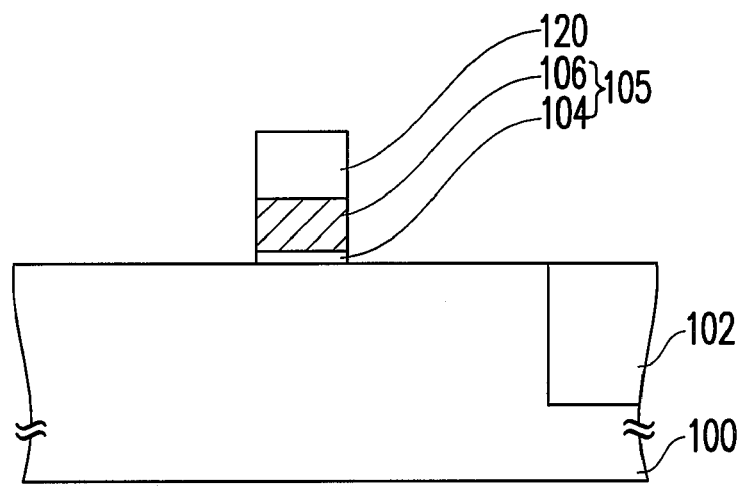

As shown in FIG. 1B, a patterned mask layer 120, for example, a patterned resist layer, is formed over the conductive layer 106. Using the patterned mask layer 120 as an etching mask, the conductive layer 106 and the gate dielectric layer 104 are defined to form the gate electrode 105.

Figure 1C:
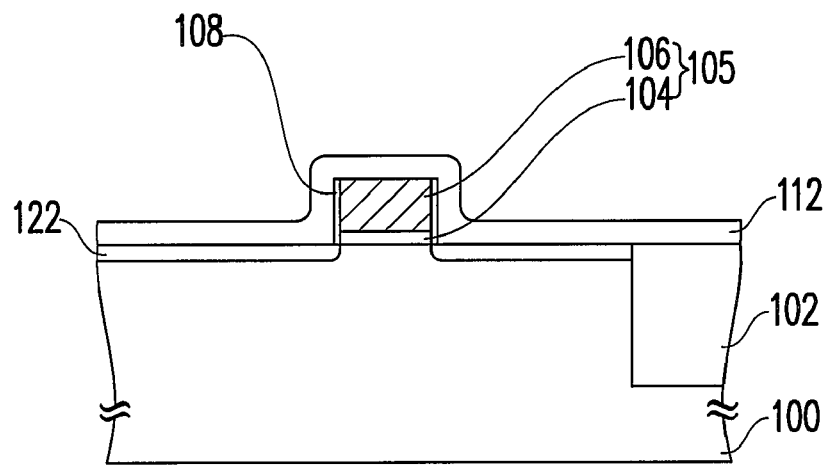

Then, as shown in FIG. 1C, the patterned mask layer 120 is removed. Later on, a liner layer 108 is formed over the substrate 100. Thereafter, ion implantation is performed to form lightly doped drain (LDD) regions 122 in the substrate 100 at both sides of the gate electrode 105. Then, a passivation layer 112 is conformally formed over the substrate 100 and covering the gate electrode 105. The passivation layer 112 is, for example, a carbon-containing silicon nitride layer.

Figure 1D:
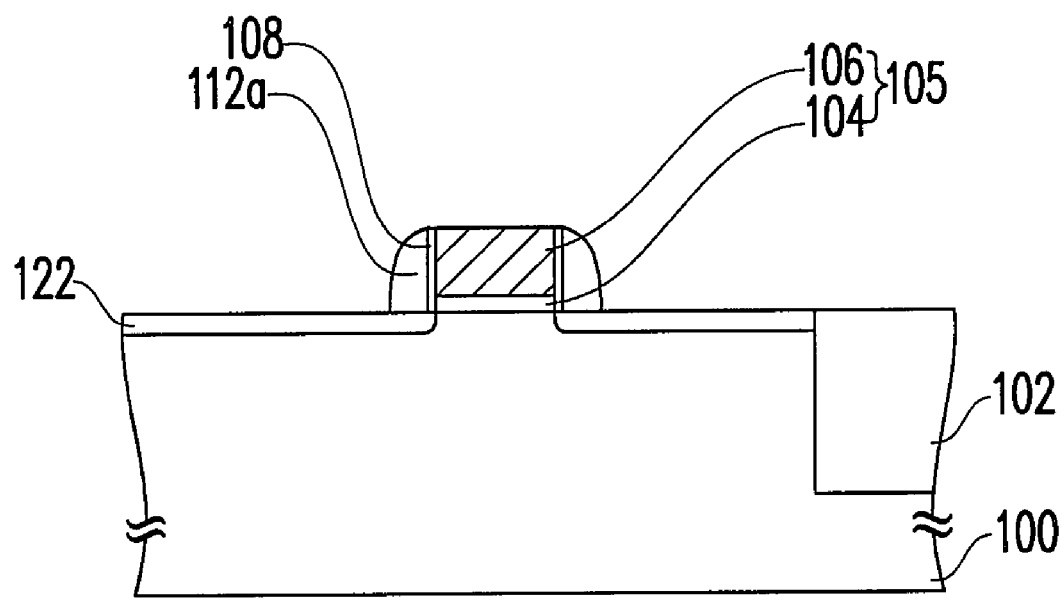

Referring to FIG. 1D, etching back the passivation layer 112 until a top surface of the gate electrode 105 is exposed, so that spacers 112a are formed on sidewalls of the gate electrode 105.

Figure 1E:
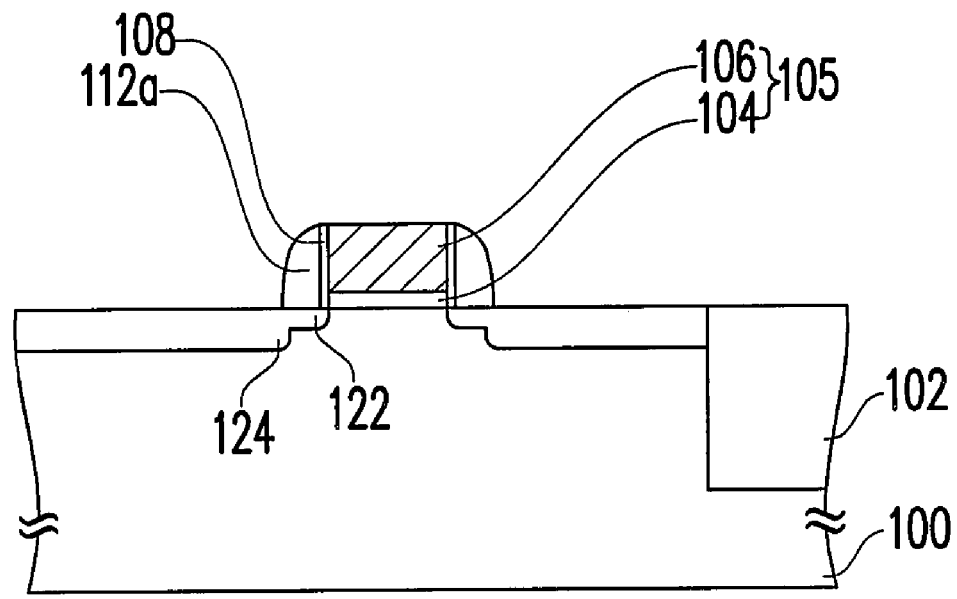

Referring to FIG. 1E, using the spacers 112a as masks, ion implantation is performed to form source/drain regions 124 in the substrate 100 at both sides of the gate electrode 105 and beside the LDD regions 122.

As mentioned above, the uniformity of the passivation layer (silicon nitride layer) 112 is greatly improved by using the method for forming the carbon-containing silicon nitride layer proposed in this invention.

Taking silicon nitride passivation layer 112 in the above embodiment as an example, the process parameters of the LPCVD process for forming the carbon-containing silicon nitride layer 112 are as follows. Gas source: disilane ($Si_2H_6$) with a gas flow rate <50 sccm (standard cubic centimeter per minute), $NH_3$ and the carbon-source precursor ($C_2H_4$) with a gas flow rate <2 slm (standard liter per minute); the reaction pressure is below 250 Torr and the reaction temperature is below 800° C. The carbon content of the resultant silicon nitride layer ranges from about 9% to about 30%.

Using the carbon-containing silicon nitride layer formed by the method proposed in this invention as the spacer, the trapping efficiency of free hydrogen is increased in the device and negative bias temperature instability (NBTI) of the device is improved.

Figure 2A:
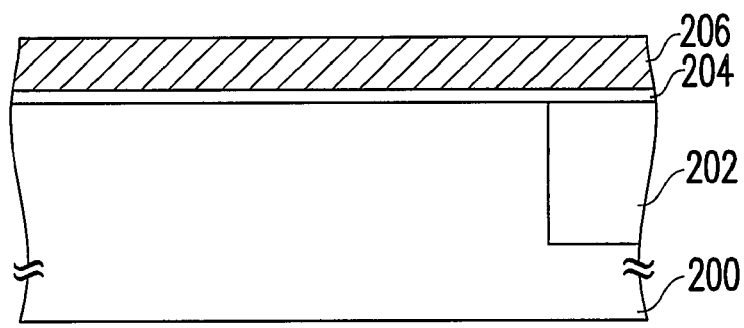
FIGS. 2A to 2F are cross-sectional views of the fabrication process steps for a flash memory according to another preferred embodiment of this invention.

FIGS. 2A to 2F are cross-sectional views of the fabrication process steps for a gate structure according to another preferred embodiment of this invention. Referring to FIG. 2A, a substrate 200 having a gate dielectric layer 204 and at least an isolation structure 202 is provided. A conductive layer 206 is formed on the gate dielectric layer 204. The material of the conductive layer 206 can be polysilicon or other suitable materials, for example.

Figure 2B:
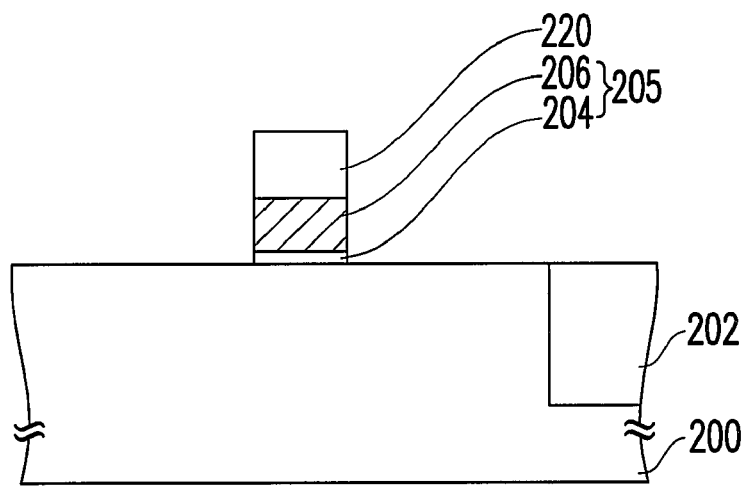

As shown in FIG. 2B, a patterned mask layer 220, for example, a patterned resist layer, is formed over the conductive layer 206. Using the patterned mask layer 220 as an etching mask, the conductive layer 206 and the gate dielectric layer 204 are defined to form the gate electrode 205.

Figure 2C:
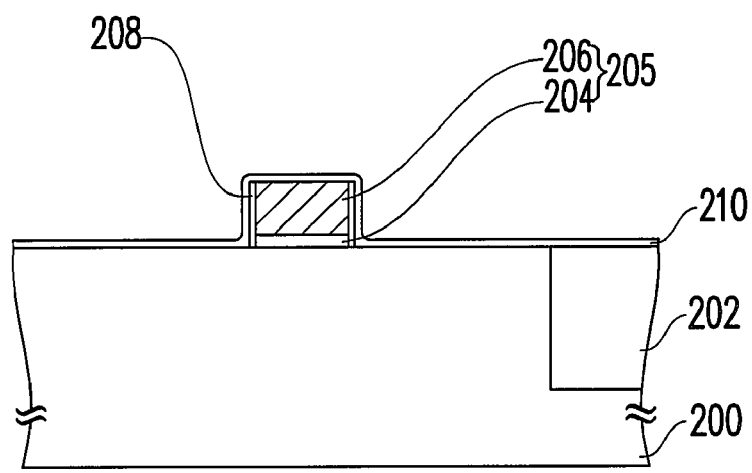

In FIG. 2C, the patterned mask layer 220 is removed. Later on, a liner layer 208 is formed over the substrate 200 and an offset material layer 210 is conformally formed over the substrate 200 and covering the gate electrode 205. The offset material layer 210 can be a single, carbon-containing silicon nitride layer or a composite layer of a silicon oxide layer and a carbon-containing silicon nitride layer, for example. Either way, the carbon-containing silicon nitride layer is formed by using the method proposed in this invention. The exemplary LPCVD process parameters for forming the carbon-containing silicon nitride layer 210 are: gas source: disilane ($Si_2H_6$) with a gas flow rate <50 sccm (standard cubic centimeter per minute), $NH_3$ and the carbon-source precursor ($C_2H_4$) with a gas flow rate <2 slm (standard liter per minute); the reaction pressure is below 250 Torr and the reaction temperature is below 800° C. The carbon content of the resultant silicon nitride layer ranges from about 9% to about 30%.

Figure 2D:
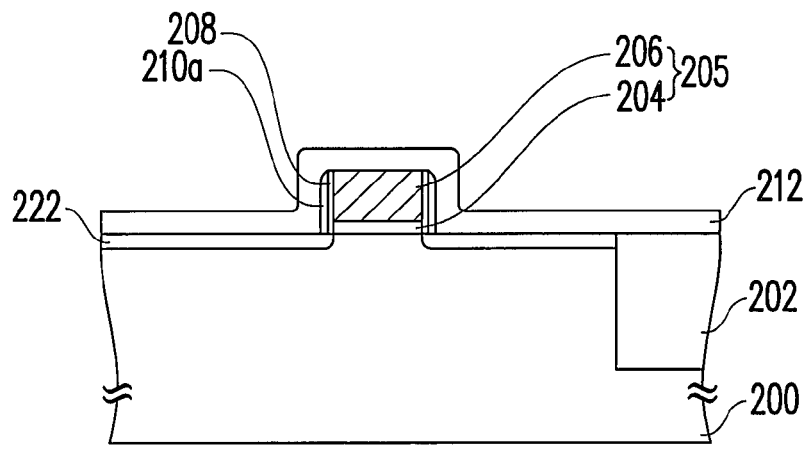

Referring to FIG. 2D, the offset material layer 210 is etched back until a top surface of the gate electrode 205 is exposed, so as to form offset spacers 210a on both sidewalls of the gate electrode 205. Then, using the offset spacers 210a as masks, ion implantation is performed to form lightly doped drain (LDD) regions 222 in the substrate 200 at both sides of the gate electrode 205. Afterwards, a passivation layer 212 is conformally formed over the substrate 200 and covering the gate electrode 205. The passivation layer 212 is, for example, a carbon-containing silicon nitride layer or a composite layer comprising at least a carbon-containing silicon nitride layer, for example. The carbon-containing silicon nitride layer is again formed by using the method proposed in this invention, using similar LPCVD process parameters recited in the above step, containing about 9% to about 20% of carbon.

Figure 2E:
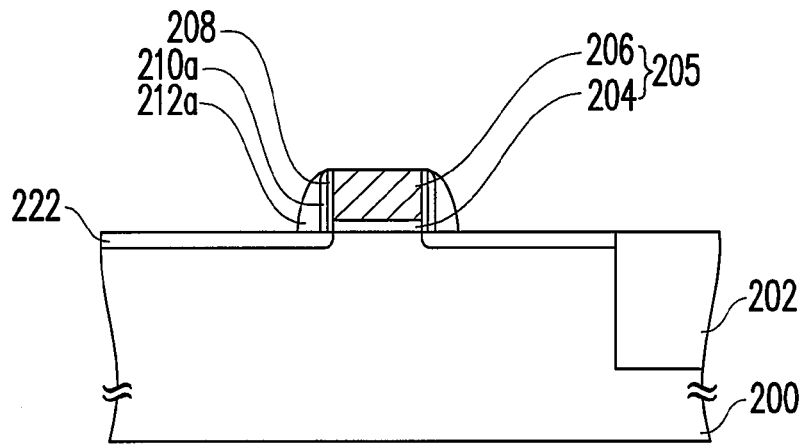

Referring to FIG. 2E, etching back the passivation layer 212 until a top surface of the gate electrode 205 is exposed, so that spacers 212a are formed on the sidewalls of the offset spacers 210a.

Figure 2F:
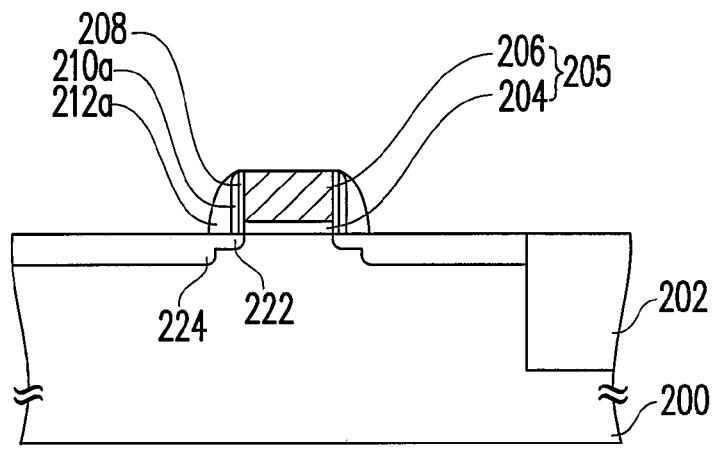

Referring to FIG. 2F, using the offset spacers 210a and the spacers 212a as masks, ion implantation is performed to form source/drain regions 224 in the substrate 200 and beside the LDD regions 222.

According to the preferred embodiments, the above method for forming the carbon-containing silicon nitride layer can be applied to the form the offset spacer and the spacer in the gate structure. However, the above method proposed in this invention can also be applied or incorporated in the fabrication processes of other semiconductor devices.

In conclusion, the present invention has at least the following advantages:

1. The present invention provides a method for forming a silicon nitride layer having better within wafer uniformity, wafer-to-wafer uniformity and lot-to-lot uniformity, when compared with the conventional silicon nitride layer.

2. The present invention can increase the carbon content in the resultant silicon nitride layer, thus reducing boron diffusion and improving the electrical characteristics of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a gate, comprising:
providing a substrate having a gate dielectric layer thereon;
forming a conductive layer on the gate dielectric layer;
patterning the conductive layer and the gate dielectric layer to form a gate electrode;
forming offset spacers on the sidewalls of the gate electrode, the material of the offset spacers is carbon-containing silicon nitride;
forming a material layer over the substrate and covering the gate electrode, wherein the material layer comprises a carbon-containing silicon nitride layer formed by low pressure chemical vapor deposition (LPCVD) using disilane, ammonia and at least a carbon-source precursor as reactant gases;
etching back the material layer to form spacers over sidewalls of the gate electrode; and
forming a source/drain region in the substrate.

2. The method according to claim 1, wherein the carbon-containing silicon nitride layer has a carbon content higher than 9%.

3. The method according to claim 2, wherein the carbon-containing silicon nitride layer is formed by a single wafer tool.

4. The method according to claim 1, the step of forming the offset spacers comprises:
forming a carbon-containing silicon nitride offset material layer over the substrate; and
etching back the carbon-containing silicon nitride offset material layer to form the offset spacers on the sidewalls of the gate electrode.

5. The method according to claim 4, wherein the carbon-containing silicon nitride offset material layer is formed by low pressure chemical vapor deposition (LPCVD) using disilane, ammonia and at least a carbon-source precursor as reactant gases.

6. The method according to claim 5, wherein the carbon-containing silicon nitride offset material layer has a carbon content higher than 9%.

7. The method according to claim 5, wherein the carbon-containing silicon nitride offset material layer is formed by a single wafer tool.

8. The method according to claim 1, wherein the carbon-source precursor is selected from the group consisting of TEASAT (triethylarsenate, $C_6H_{15}AsO_4$), Trans-LC ($C_2H_2Cl_2$), TCS $SiHCl_3$), TMAl (trimethyl aluminum $Al(CH_3)_3$), $C_2H_4$, $C_3H_6$, TEB (triethylborate, $B(OC_2H_5)_3$), TEPO (triethylphosphate, $PO(C_2H_5O)_3$), TDMAT (tetrakis-dimethylamino titanium, $Ti[N(CH_3)_2]_4$) and combinations thereof.

9. The method according to claim 5, wherein the carbon-source precursor is selected from the group consisting of TEASAT (triethylarsenate, $C_6H_{15}AsO_4$), Trans-LC ($C_2H_2Cl_2$), TCS trichlorosilane, $SiHCl_3$), TMAl (trimethyl aluminum, $Al(CH_3)_3$), $C_2H_4$, $C_3H_6$, TEB (triethylborate, $B(OC_2H_5)_3$), TEPO (triethylphosphate, $PO(C_2H_5O)_3$), TDMAT (tetrakis-dimethylamino titanium, $Ti[N(CH_3)_2]_4$) and combinations thereof.

10. The method according to claim 1, wherein the carbon-containing silicon nitride layer has a carbon content ranging from about 9% to about 30%.

11. The method according to claim 1, wherein a gas flow rate of disilane ($Si_2H_6$) is less than 50 sccm (standard cubic centimeter per minute).

12. The method according to claim 1, wherein a gas flow rate of the carbon-source precursor is less than 2 slm (standard liter per minute).

13. The method according to claim 1, wherein a reaction pressure is below 250 Torr.

14. The method according to claim 1, wherein a reaction temperature is below 800° C.

* * * * *